United States Patent [19]
Medhekar et al.

[11] Patent Number: 5,654,648
[45] Date of Patent: Aug. 5, 1997

[54] OUTPUT BUFFER CIRCUIT WITH LOW POWER PRE-OUTPUT DRIVE

[75] Inventors: Ajit K. Medhekar, San Jose; Eric Voelkel, Santa Clara, both of Calif.

[73] Assignee: Alliance Semiconductor Corporation, San Jose, Calif.

[21] Appl. No.: 399,941

[22] Filed: Mar. 6, 1995

[51] Int. Cl.$^6$ .................. H03K 17/04; H03K 19/0185
[52] U.S. Cl. .................. 326/17; 326/27; 326/58; 326/83
[58] Field of Search .................. 326/27, 83, 87, 326/121, 17, 58

[56] References Cited

U.S. PATENT DOCUMENTS

| | | | |
|---|---|---|---|
| 4,527,081 | 7/1985 | Stewart | 326/83 |
| 4,988,888 | 1/1991 | Hirose | 326/87 |
| 5,045,722 | 9/1991 | Yang et al. | 326/83 |
| 5,151,621 | 9/1992 | Goto | 326/58 |
| 5,179,300 | 1/1993 | Rolandi | 326/83 |
| 5,377,149 | 12/1994 | Gaultier | 326/83 |
| 5,559,465 | 9/1996 | Shah | 326/17 |

Primary Examiner—Edward P. Westin
Assistant Examiner—Benjamin D. Driscoll
Attorney, Agent, or Firm—Limbach & Limbach L.L.P.

[57] ABSTRACT

An output buffer circuit with low power pre-output driving capability uses existing output drivers and includes input inverters with three-state outputs interposed between the input and output stages and a feedback circuit with three-state outputs connected to the output stage. During normal data transmission, the input inverters buffer the incoming complementary data signals driving the pull-up and pull-down transistors in the output stage while the three-state outputs of the feedback circuit are turned off. Upon receiving an active pre-output control signal, the input inverters are disabled, thereby isolating the pull-up and pull-down transistors from the incoming complementary data signals, and the feedback circuit is enabled. The enabled feedback circuit monitors the signal level of the output signal from the output stage. When the output signal is a logic 0, the feedback circuit turns the pull-up and pull-down transistors on and off, respectively, and when the output signal is a logic 1, the feedback circuit turns the pull-up and pull-down transistors off and on, respectively. Once the output signal has reached the desired pre-output signal level intermediate to the normal logic 0 and logic 1 levels, the feedback circuit turns off both the pull-up and pull-down transistors. Accordingly, an output signal at the desired pre-output signal level is provided with no DC power consumption by the output stage.

23 Claims, 4 Drawing Sheets

OUTPUT BUFFER CIRCUIT WITH LOW POWER PRE-OUTPUT DRIVE

BACKGROUND OF THE INVENTION

1. Field of the Invention

The present invention relates to logic signal drivers having three-state outputs, and in particular, to logic signal drivers having three-state outputs which also generate a pre-output signal having a signal level intermediate to normal logic 0 and logic 1 signal levels.

2. Description of the Related Art

Referring to FIG. 1, a common form of logic signal driver with a pre-output drive capability typically includes a data signal driver and a pre-output circuit. A common data signal driver includes two NAND gates X1, X2, two inverters X3, X4 and totem-pole-coupled pull-up M1 and pull-down M2 MOSFETs, connected as shown. The pre-output circuit includes totem-pole-coupled pull-up M3 and pull-down M4 MOSFETs, connected as shown.

When the output enable signal OE is low (regardless of the values of the incoming complementary data signals DATA,/DATA), the outputs of the NAND gates X1, X2 (nodes 1 and 2) and inverters X3, X4 (nodes 3 and 4) will be high and low, respectively. This results in the NMOS pull-up M1 and pull-down M2 transistors being turned off, thereby causing the output signal OUT to be floating at a high impedance. When the output enable signal OE is high, the signal driver circuit is enabled for driving the output node. When both data signals DATA,/DATA are precharged to logic 0, e.g. VSS (or ground GND), the output signal OUT will be floating at a high impedance. Then, when either of the data signals, DATA,/DATA (but not both) goes high, the corresponding one of the NAND gates X1, X2 and inverters X3, X4 will turn on the corresponding pull-up transistor M1/M2, thereby causing the output signal OUT to go high or low.

The pre-output circuit (MOSFETs M3 and M4) drive the output node in response to activation of the pre-output control signal PREOUT (e.g. when the output enable signal OE is low or when both data signals DATA,/DATA are precharged low). When the pre-output control signal PRE-OUT is activated, i.e. high, both NMOS pre-output transistors M3, M4 are turned on, with the ratio of their relative device dimensions determining the voltage value (between VDD and VSS) of the output signal OUT. Accordingly, this results in DC current flowing (between VDD and VSS, or ground) during the generation of the pre-output signal. Further, to generate the pre-output signal, the dedicated pre-output drivers M3, M4 are required in addition to the normal output drivers M1, M2 used for outputting the normal logic signals.

SUMMARY OF THE INVENTION

In accordance with the present invention, an output buffer circuit with low power pre-output driving capability is provided where preexisting output driver circuitry can be used and no DC power is consumed, by such output driver circuitry during the generating of a high impedance pre-output signal. Feedback from the output signal is used (with hysteresis to prevent ringing in the output signal) to pull the output voltage level up (e.g. if it was previously low) or pull the output voltage level down (e.g. if it was previously high) to the pre-output signal level which is intermediate to the normal logic 0 and logic 1 levels. No totem-pole output current flows since, at any given time, only one output pull-up or pull down circuit will be turned on. Existing pull-up and pull-down circuits are used for generating the pre-output signal since they are normally turned off anyway during the generation of the pre-output signal. This advantageously produces a more compact design since fewer output driver devices are required and DC power consumption by the output drivers during generation of the pre-output signal is avoided.

An apparatus including an output buffer circuit with low power pre-output driving capability in accordance with one embodiment of the present invention includes an output circuit and a control circuit. The output circuit is for receiving logic signals and pre-output drive signals and providing an output signal, wherein the output signal has logic 0 and logic 1 signal levels in accordance with the logic signals and a pre-output signal level intermediate to the logic 0 and logic 1 signal levels in accordance with the pre-output drive signals. The control circuit is coupled to the output circuit and is for receiving input signals, a pre-output control signal and the output signal and in accordance therewith providing the logic signals and the pre-output drive signals, wherein the pre-output drive signals turn the output circuit on and off in accordance with the pre-output signal level of the output signal.

In a preferred embodiment, the output circuit includes an output node driven by pull-up and pull-down circuits coupled thereto and the control circuit includes a feedback circuit for receiving the pre-output control signal and the output signal and in accordance therewith providing the pre-output drive signals. The pre-output drive signals together include first, second and third pairs of signal states in accordance with the output signal and pre-output control signal, and in accordance with one state of the pre-output control signal the first pair of pre-output drive signal states is activated when the output signal is at a logic 0 signal level, the second pair of pre-output drive signal states is activated when the output signal is at a logic 1 signal level and the third pair of pre-output drive signal states is activated when the output signal is at the pre-output signal level.

These and other features and advantages of the present invention will be understood upon consideration of the following detailed description of the invention and the accompanying drawings.

DETAILED DESCRIPTION OF THE INVENTION

Figure 1:
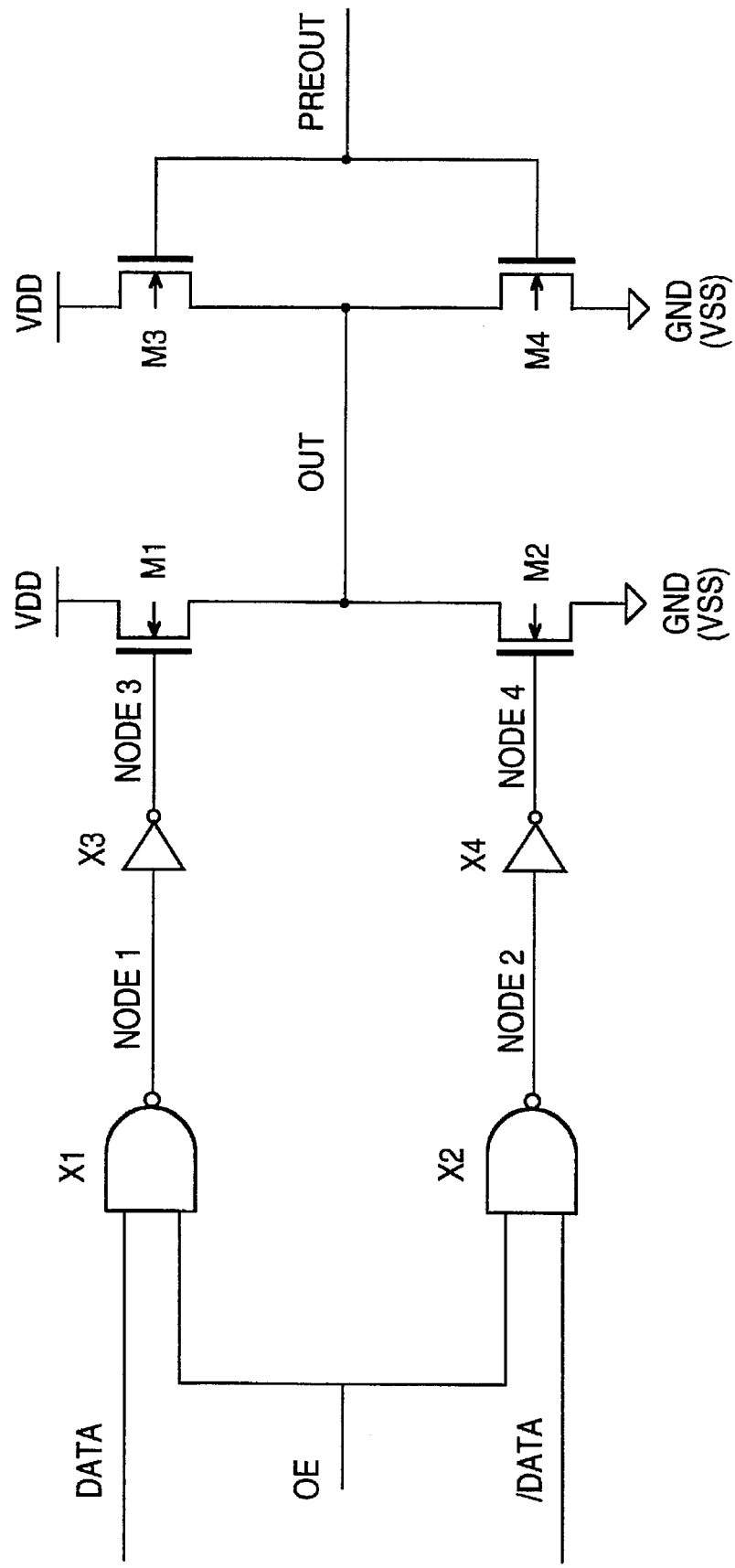
FIG. 1 is a logic diagram of a conventional signal driver circuit with pre-output signal driving capability.
Figure 2:
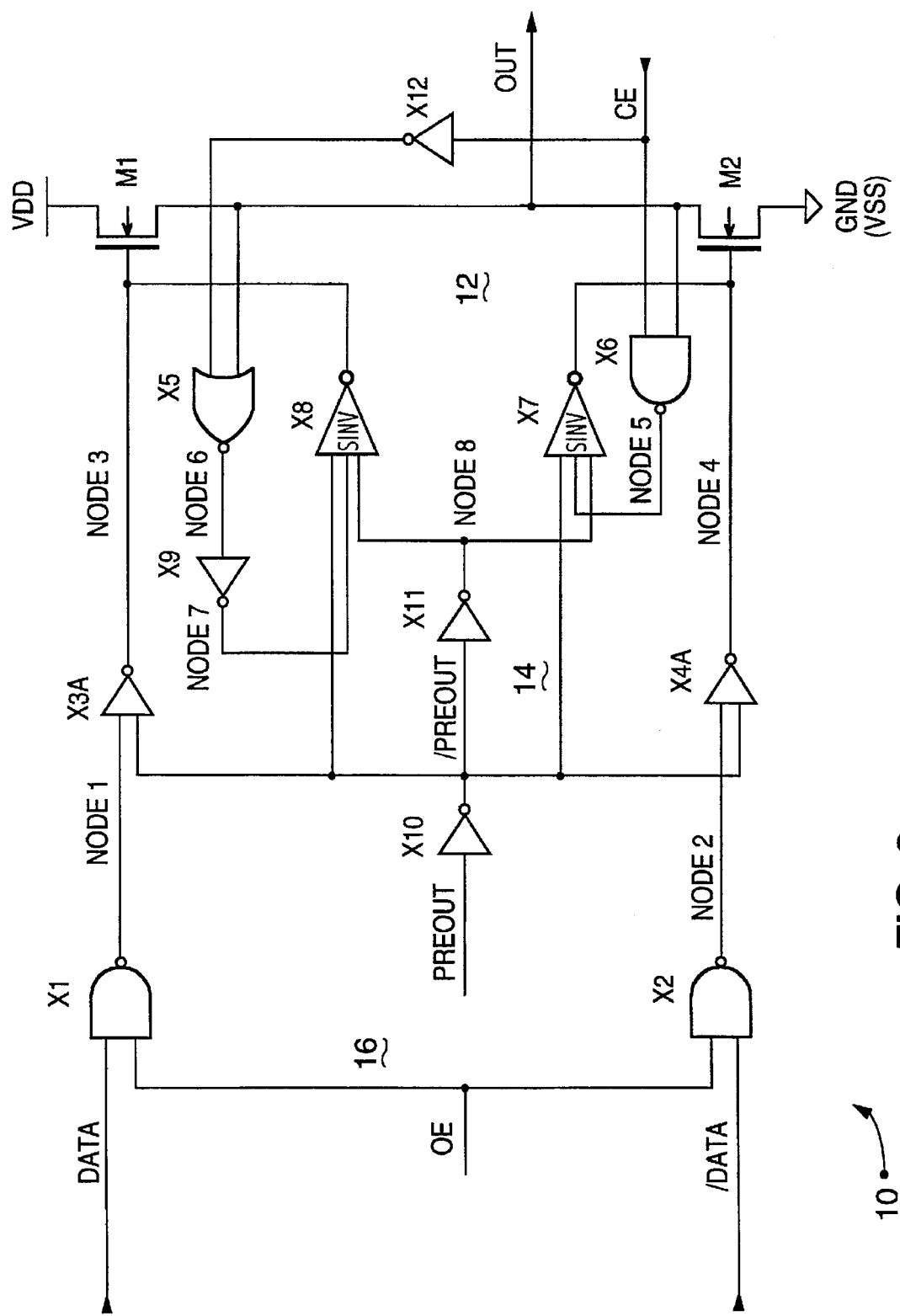
FIG. 2 is a logic diagram of a signal driver circuit with low power pre-output driving capability in accordance with one embodiment of the present invention.

Referring to FIG. 2, an output buffer circuit 10 with low power pre-output driving capability in accordance with one embodiment of the present invention includes an output circuit 12 and a pre-output control circuit 14. The output circuit 12 is formed by the existing output driver elements, namely the NMOS pull-up M1 and pull-down M2 transistors. The control circuit 14 includes three-state inverters X3A, X4A, X7 and X8, inverters X9, X10 and X11, NOR gate X5 and NAND gate X6, connected as shown, and is controlled by the pre-out control signal PREOUT, the output signal OUT and a chip enable signal CE. (The pre-output control signal PREOUT is logically equivalent to the signal which causes precharging of the complementary data signals DATA./DATA and is active high, while the chip enable signal is active high during power-up of the circuit and is intended to prevent DC current from flowing during power-down.) Additionally, an input buffer circuit 16 can be included for buffering the incoming data signals. The input buffer circuit 16 includes NAND gates X1 and X2.

During normal output buffer operation, i.e. during normal data transmission, the output enable signal OE is asserted thereby enabling input NAND gates X1 and X2, and the pre-output control signal PREOUT is de-asserted, i.e. at a logic 0, thereby enabling three-state inverters X3A and X4A and disabling three-state inverters X7 and X8.

Figure 3:
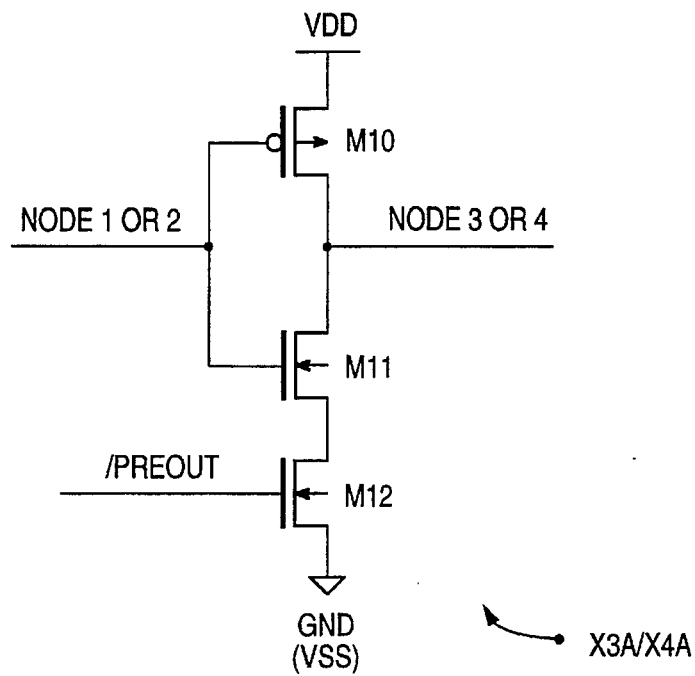
FIG. 3 is a schematic diagram of inverters X3A and X4A of FIG. 2.
Figure 4:
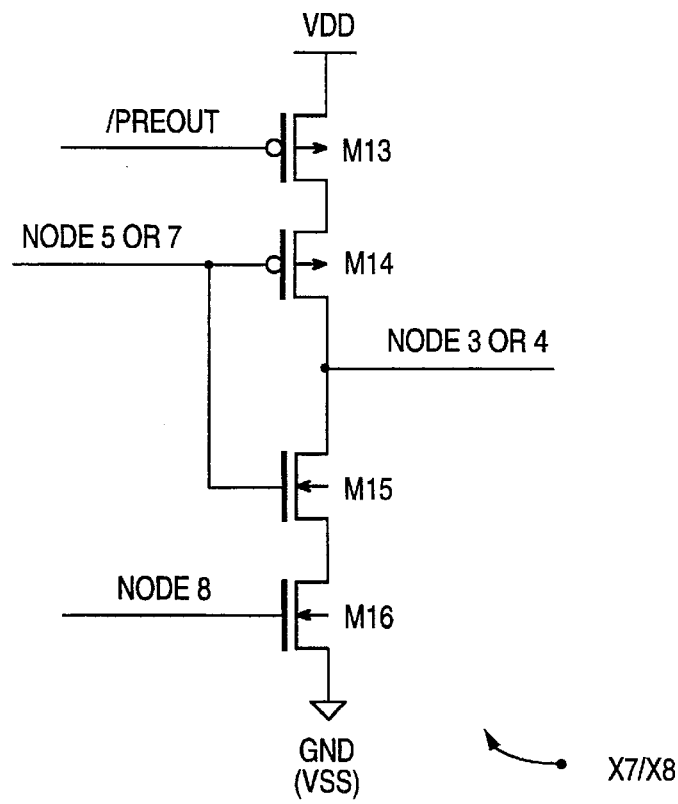
FIG. 4 is a schematic diagram of inverters X7 and X8 of FIG. 2.

Referring to FIG. 3, inverters X3A and X4A are enabled and disabled when the pre-output control signal PREOUT is low and high, respectively, due to the totem-pole connection of PMOS pull-up transistor M10 and NMOS pull-down transistors M11 and M12. Referring to FIG. 47 similarly, three-state inverters X7 and X8 are enabled and disabled when the pre-output control signal PREOUT is high and low, respectively, due to the totem-pole connection of PMOS pull-up transistors M13 and M14 and NMOS pull-down transistors M15 and M16.

Referring again to FIG. 2, during pre-output operation, e.g. between data transmissions, the input data signals, DATA./DATA precharge low, thereby resulting in logic 1 signal levels at nodes 1 and 2 due to the operation of input NAND gates X1 and X2. However, during pre-output operation, the pre-output control signal PREOUT is active, thereby disabling three-state inverters X3A and X4A. This results in the isolation of nodes 3 and 4 from effects of the logic levels present at nodes 1 and 2. Further, with the pre-output control signal PREOUT active, three-state inverters X7 and X8 are enabled, thereby allowing the control circuit 14 to drive the output circuit 12 via nodes 3 and 4. If the output signal OUT is initially high, i.e. as when the previous output signal OUT had been a logic 1, NAND gate X6 will produce a low signal at node 5 and NOR gate X5 will produce a low signal at node 6 which is inverted to a high signal at node 7 through inverter X9. These signals at node 5 and 7 are inverted by the enabled, three-state inverters X7 and X8, thereby producing a logic 1 signal at node 4 and a logic 0 signal at node 3, thereby turning on the NMOS pull-down transistor M2 and turning off the NMOS pull-up transistor M1. This causes the output signal OUT to begin transitioning to a logic 0 state.

Conversely, when the output signal OUT is initially low, i.e. as when the previous output signal OUT had been a logic 0, node 5 is high due to the operation of NAND gate X6 and nodes 6 and 7 are high and low due to operations of NOR gate X5 and inverter X9, respectively. The signals at nodes 5 and 7 are inverted through the enabled, three-state inverters X7 and X8, resulting in a logic 1 at node 3 and a logic 0 at node 4, thereby turning on the NMOS pull-up transistor M1 and turning off the NMOS pull-down transistor M2. This causes the output signal OUT to begin transitioning toward a logic 1 state.

As discussed above, the control circuit 14, in accordance with the pre-output control signal PREOUT, initially rams on either the NMOS pull-up transistor M1 or the NMOS pull-down transistor M2 in the output circuit 12, thereby causing the output signal OUT to begin transitioning to a logic 1 or logic 0, respectively. The level, or value, of the output signal OUT which corresponds to the pre-output signal level intermediate to logic 0 and logic 1 levels is determined by the input thresholds for NAND gate X6 and NOR gate X5. In other words, this intermediate value is determined by the range in which NAND gate X6 considers the output signal OUT to be low and the range in which NOR gate X5 considers the output signal OUT to be high. Hysteresis is introduced by establishing these ranges in such a manner as to produce a relatively high threshold for NAND gate X6 and a relatively low threshold for NOR gate X5. (These "thresholds" are the input levels of these gates which will cause their output states to switch.) Accordingly, if the output signal OUT starts high, the control circuit 14 will force the output signal OUT low until it is below the high threshold for NAND gate X6. At this point, the output signal OUT will be within the range which NAND gate X6 considers the output signal OUT to be low and NOR gate X5 considers the output signal OUT to be high, thereby causing a situation where neither section of the control circuit 14 is activated. Similarly, if the output signal OUT starts low, the control circuit 14 forces the output signal OUT to a high level until it is above the low threshold for NOR gate X5. At this point, NOR gate X5 considers the output signal OUT to be high and NAND gate X6, with its higher threshold, considers the output signal OUT to be low, thereby again causing both sections of the control circuit 14 to be de-activated.

In accordance with one embodiment of the present invention, a logic 1 signal level is specified as being 2.4 volts or more, and a logic 0 signal level is specified as being 0.4 volts or less. Accordingly, the desired intermediate level for the pre-output signal is between these two voltages. Since the devices responsible for driving the output signal OUT high are typically weaker than those responsible for driving the output signal OUT low, the high side of this range should generally be targeted. Hence, the threshold for NOR gate X5 is preferably approximately 1.1 volts and the threshold for NAND gate X6 is preferably approximately 2.9 volts. This causes the intermediate range to be between 1.1 volts and 2.9 volts, placing the midpoint at 2.0 volts. Since there is some delay from the time that NAND gate X6 or NOR gate X5 switches states until output devices M1 and M2 are turned off, there will be some overshoot between these thresholds. Accordingly, establishment of the thresholds for NAND gate X6 and NOR gate X5 should take into account the minimum capacitance present at the output node so as to insure that such overshoot does not cause the output signal OUT to go beyond this intermediate range.

Figure 5:
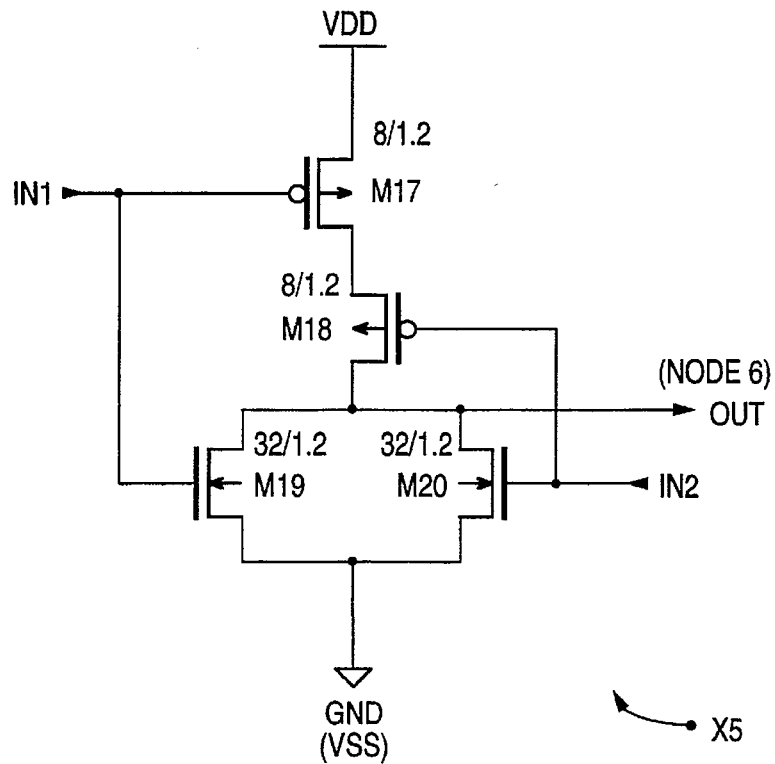
FIG. 5 is a schematic diagram of NOR gate X5 of FIG. 2.
Figure 6:
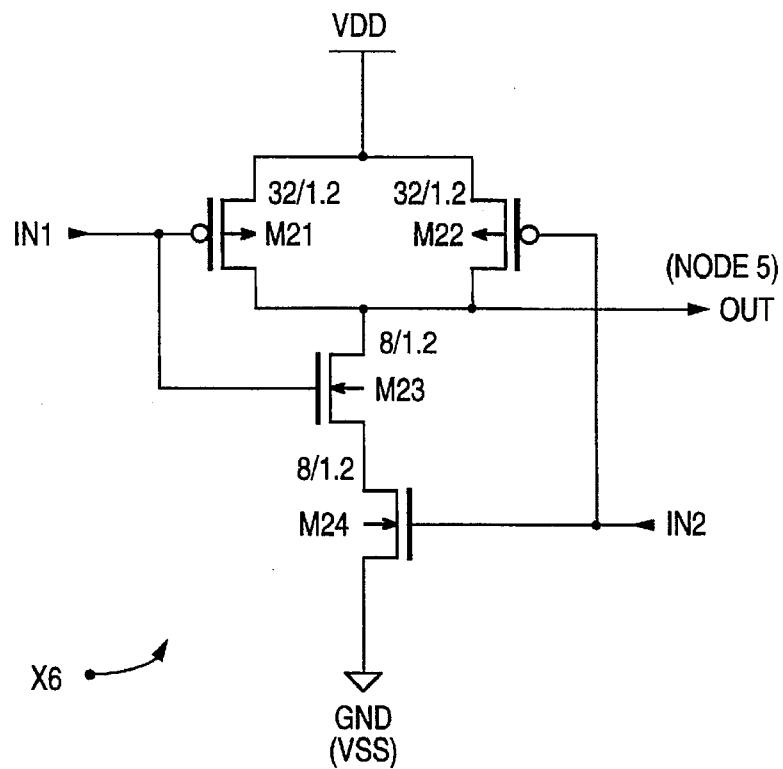
FIG. 6 is a schematic diagram of NAND gate X6 of FIG. 2.

Referring to FIGS. 5 and 6, the above-discussed thresholds for NOR gate X5 and NAND gate X6 can be established by appropriately scaling the dimensions of the NMOS and PMOS devices used therein to construct these gates. For example, as shown in FIGS. 5 and 6, the width and length of the drain-to-source channels of PMOS transistor M18 and NMOS transistor M23 are 8 microns and 1.2 microns, respectively.

In accordance with the foregoing discussion, it should be understood that use of or reliance upon the chip enable signal CE can be avoided by removing inverter X12 and replacing both NAND gate X6 and NOR gate X5 with inverters having the output signal OUT as their inputs. In accordance with the foregoing discussion, the input thresholds for such inverters can be established as desired by appropriately scaling the device dimensions so as to produce the desired hysteresis.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an output buffer circuit with low power pre-output driving capability, said output buffer circuit comprising:

an output circuit for receiving first and second logic signals and first and second pre-output drive signals and providing an output signal, wherein said output signal includes prior and present signal states, and wherein a portion of said output circuit is turned on and said output signal has logic 0 and logic 1 signal levels in accordance with said first and second logic signals, and further wherein said output circuit is turned off after said output signal has reached a pre-output signal level intermediate to said logic 0 and logic 1 signal levels in accordance with said first and second pre-output drive signals; and a control circuit, coupled to said output circuit, for receiving first and second input signals, a single pre-output control signal and said output signal and in accordance therewith providing said first and second logic signals and said first and second pre-output drive signals, wherein said first and second pre-output drive signals turn portions of said output circuit on and off in accordance with said pre-output signal level of said present output signal state irrespective of said prior output signal state.

2. The apparatus of claim 1, wherein said output circuit comprises an output node and pull-up and pull-down circuits coupled thereto.

3. The apparatus of claim 1, wherein said control circuit comprises a feedback circuit for receiving said pre-output control signal and said output signal and in accordance therewith providing said first and second pre-output drive signals.

4. The apparatus of claim 1, further comprising an input circuit, coupled to said control circuit, for receiving and buffering a pair of complementary data signals and providing said first and second input signals.

5. A method of driving an output buffer circuit for providing a low power pre-output signal, said method comprising the steps of:

receiving first and second input signals;
    receiving a single pre-output control signal;
    providing first and second logic signals in accordance with said first and second input signals and said single pre-output control signal;
    receiving first and second pre-output drive signals;
    driving an output buffer circuit for providing an output signal, wherein said output signal includes prior and present signal states, and wherein a portion of said output buffer circuit is turned on and said output signal has logic 0 and logic 1 signal levels in accordance with said first and second logic signals, and further wherein said output buffer circuit is turned off after said output signal has reached a pre-output signal level intermediate to said logic 0 and logic 1 signal levels in accordance with said first and second pre-output drive signals;
    receiving said output signal; and
    providing said first and second pre-output drive signals in accordance with said output signal and said single pre-output control signal, wherein said first and second pre-output drive signals turn portions of said output buffer circuit on and off in accordance with said pre-output signal level of said present output signal state irrespective of said prior output signal state.

6. The method of claim 5, wherein said step of driving an output buffer circuit for providing an output signal comprises driving pull-up and pull-down circuits coupled to an output node.

7. The method of claim 5, further comprising the step of receiving and buffering a pair of complementary data signals and providing said first and second input signals.

8. A low power method of driving an output buffer circuit and selectively causing said output buffer circuit to provide an output signal having a pre-output signal level intermediate to logic 0 and logic 1 signal levels, wherein said output buffer circuit includes an input stage for receiving and buffering complementary data signals and an output stage with an output node and pull-up and pull-down circuits coupled thereto for providing said output signal with said logic 0 and logic 1 signal levels in accordance with said buffered complementary data signals, said method comprising the steps of:

receiving a pre-output control signal;
    isolating said pull-up and pull-down circuits from said buffered complementary data signals in accordance with said pre-output control signal;
    receiving said output signal from said output stage;
    activating first and second pre-output drive signals in accordance with said pre-output control signal and said output signal, wherein said activated first and second pre-output drive signals cause said output buffer circuit to turn off after said output signal has reached said pre-output signal level intermediate to said logic 0 and logic 1 signal levels.

9. An apparatus including a low power pre-output circuit for driving an output buffer circuit and selectively causing said output buffer circuit to provide an output signal having a pre-output signal level intermediate to logic 0 and logic 1 signal levels, wherein said output buffer circuit includes an input stage for receiving and buffering complementary data signals and an output stage with an output node and pull-up and pull-down circuits coupled thereto for providing said output signal with said logic 0 and logic 1 signal levels in accordance with said buffered complementary data signals, said pre-output circuit comprising:

an isolation circuit for coupling to said output stage and receiving a pre-output control signal and in accordance therewith isolating said pull-up and pull-down circuits from said buffered complementary data signals; and a control circuit for receiving said pre-output control signal and coupling to said output stage and receiving therefrom said output signal and in accordance therewith activating first and second pre-output drive signals which cause said output buffer circuit to turn off after said output signal has reached said pre-output signal level intermediate to said logic 0 and logic 1 signal levels.

10. An apparatus including an output buffer circuit with low power pre-output driving capability, said output buffer circuit comprising:

an output circuit for receiving first and second logic signals and first and second pre-output drive signals and providing an output signal, wherein said output signal includes prior and present signal states, and wherein said output signal has logic 0 and logic 1 signal levels in accordance with said first and second logic signals and a pre-output signal level intermediate to said logic 0 and logic 1 signal levels in accordance with said first and second pre-output drive signals; and a control circuit, coupled to said output circuit, for receiving first and second input signals, a single pre-output control signal and said output signal and in accordance therewith providing said first and second logic signals and said first and second pre-output drive signals, wherein said first and second pre-output drive signals turn portions of said output circuit on and off in accordance with said pre-output signal level of said present output signal state irrespective of said prior output signal state, and wherein said control circuit comprises a feedback circuit for receiving said single pre-output control signal and said output signal and in accordance therewith providing said first and second pre-output drive signals, and further wherein said first and second pre-output drive signals together include first, second and third pairs of signal states in accordance with said output signal and said single pre-output control signal, and still further wherein in accordance with a first state of said single pre-output control signal said first pair of pre-output drive signal states is activated when said output signal is at said logic 0 signal level, said second pair of pre-output drive signal states is activated when said output signal is at said logic 1 signal level and said third pair of pre-output drive signal states is activated when said output signal is at said pre-output signal level.

11. An apparatus including an output buffer circuit with low power pre-output driving capability, said output buffer circuit comprising:

an output circuit for receiving first and second logic signals and first and second pre-output drive signals and providing an output signal, wherein said output signal includes prior and present signal states, and wherein said output signal has logic 0 and logic 1 signal levels in accordance with said first and second logic signals and a pre-output signal level intermediate to said logic 0 and logic 1 signal levels in accordance with said first and second pre-output drive signals; and a control circuit, coupled to said output circuit, for receiving first and second input signals, a single pre-output control signal and said output signal and in accordance therewith providing said first and second logic signals and said first and second pre-output drive signals, wherein said first and second pre-output drive signals turn portions of said output circuit on and off in accordance with said pre-output signal level of said present output signal state irrespective of said prior output signal state, and wherein said control circuit comprises a feedback circuit for receiving said single pre-output control signal and said output signal and in accordance therewith providing said first and second pre-output drive signals, and further wherein said feedback circuit operates with hysteresis so that said pre-output signal level of said output signal is one of a plurality of signal levels between said logic 0 and logic 1 signal levels.

12. An apparatus including a low power pre-output circuit for driving an output buffer circuit and selectively causing said output buffer circuit to provide an output signal having a pre-output signal level intermediate to logic 0 and logic 1 signal levels, wherein said output buffer circuit includes an input stage for receiving and buffering complementary data signals and an output stage with an output node and pull-up and pull-down circuits coupled thereto for providing said output signal with said logic 0 and logic 1 signal levels in accordance with said buffered complementary data signals, said pre-output circuit comprising:

an isolation circuit for coupling to said output stage and receiving a pre-output control signal and in accordance therewith isolating said pull-up and pull-down circuits from said buffered complementary data signals; and a control circuit for receiving said pre-output control signal and coupling to said output stage and receiving therefrom said output signal and in accordance therewith activating first and second pre-output drive signals which cause said output buffer circuit to turn off after said output signal has reached said pre-output signal level intermediate to said logic 0 and logic 1 signal levels, wherein said activated first and second pre-output drive signals turn one and the other of said pull-up and pull-down circuits on and off, respectively, when said output signal is at one of said logic 0 and logic 1 signal levels and turn off said pull-up and pull-down circuits after said output signal has reached said pre-output signal level intermediate to said logic 0 and logic 1 signal levels.

13. An apparatus including a low power pre-output circuit for driving an output buffer circuit and selectively causing said output buffer circuit to provide an output signal having a pre--output signal level intermediate to logic 0 and logic 1 signal levels, wherein said output buffer circuit includes an input stage for receiving and buffering complementary data signals and an output stage with an output node and pull-up and pull-down circuits coupled thereto for providing said output signal with said logic 0 and logic 1 signal levels in accordance with said buffered complementary data signals, said pre-output circuit comprising:

an isolation circuit for coupling to said output stage and receiving a pre-output control signal and in accordance therewith isolating said pull-up and pull-down circuits from said buffered complementary data signals, wherein said isolation circuit comprises a plurality of inverters with three-state outputs; and a control circuit for receiving said pre-output control signal and coupling to said output stage and receiving therefrom said output signal and in accordance therewith activating first and second pre-output drive signals which cause said output buffer circuit to turn off after said output signal has reached said pre-output signal level intermediate to said logic 0 and logic 1 signal levels.

14. An apparatus including a low power pre-output circuit for driving an output buffer circuit and selectively causing said output buffer circuit to provide an output signal having a pre-output signal level intermediate to logic 0 and logic 1 signal levels, wherein said output buffer circuit includes an input stage for receiving and buffering complementary data signals and an output stage with an output node and pull-up and pull-down circuits coupled thereto for providing said output signal with said logic 0 and logic 1 signal levels in accordance with said buffered complementary data signals, said pre-output circuit comprising:

an isolation circuit for coupling to said output stage and receiving a pre-output control signal and in accordance therewith isolating said pull-up and pull-down circuits from said buffered complementary data signals; and a control circuit for receiving said pre-output control signal and coupling to said output stage and receiving therefrom said output signal and in accordance therewith activating first and second pre-output drive signals which cause said output buffer circuit to turn off after said output signal has reached said pre-output signal level intermediate to said logic 0 and logic 1 signal levels, wherein said control circuit comprises a plurality of circuits with hysteresis for monitoring said output signal, and wherein said control circuit generates said pre-output drive signal in accordance with said hysteresis, said output signal and said pre-output control signal.

15. The apparatus of claim 14, wherein said control circuit further comprises a plurality of inverters with three-state outputs.

16. A method of driving an output buffer circuit for providing a low power pre-output signal, said method comprising the steps of:

receiving first and second input signals;

receiving a single pre-output control signal;

providing first and second logic signals in accordance with said first and second input signals and said single pre-output control signal;

receiving first and second pre-output drive signals;

driving an output buffer circuit for providing an output signal, wherein said output signal includes prior and present signal states, and wherein said output signal has logic 0 and logic 1 signal levels in accordance with said first and second logic signals and a pre-output signal level intermediate to said logic 0 and logic 1 signal levels in accordance with said first and second pre-output drive signals;

receiving said output signal; and providing said first and second pre-output drive signals in accordance with said output signal and said single pre-output control signal by providing first and second pre-output drive signals which together include first, second and third pairs of signal states in accordance with said output signal and said single pre-output control signal, wherein said first and second pre-output drive signals turn portions of said output buffer circuit on and off in accordance with said pre-output signal level of said present output signal state irrespective of said prior output signal state, and wherein in accordance with a first state of said single pre-output control signal said first pair of pre-output drive signal states is activated when said output signal is at said logic 0 signal level, said second pair of pre-output drive signal states is activated when said output signal is at said logic 1 signal level and said third pair of pre-output drive signal states is activated when said output signal is at said pre-output signal level.

17. A method of driving an output buffer circuit for providing a low power pre-output signal, said method comprising the steps of:

receiving first and second input signals;

receiving a single pre-output control signal;

providing first and second logic signals in accordance with said first and second input signals and said single pre-output control signal;

receiving first and second pre-output drive signals;

driving an output buffer circuit for providing an output signal by driving said output buffer circuit with hysteresis so that said pre-output signal level of said output signal is one of a plurality of signal levels between said logic 0 and logic 1 signal levels, wherein said output signal includes prior and present signal states, and wherein said output signal has logic 0 and logic 1 signal levels in accordance with said first and second logic signals and a pre-output signal level intermediate to said logic 0 and logic 1 signal levels in accordance with said first and second pre-output drive signals;

receiving said output signal; and providing said first and second pre-output drive signals in accordance with said output signal and said single pre-output control signal, wherein said first and second pre-output drive signals turn portions of said output buffer circuit on and off in accordance with said pre-output signal level of said present output signal state irrespective of said prior output signal state.

18. A low power method of driving an output buffer circuit and selectively causing said output buffer circuit to provide an output signal having a pre-output signal level intermediate to logic 0 and logic 1 signal levels, wherein said output buffer circuit includes an input stage for receiving and buffering complementary data signals and an output stage with an output node and pull-up and pull-down circuits coupled thereto for providing said output signal with said logic 0 and logic 1 signal levels in accordance with said buffered complementary data signals, said method comprising the steps of:

receiving a pre-output control signal;

isolating said pull-up and pull-down circuits from said buffered complementary data signals in accordance with said pre-output control signal;

receiving said output signal from said output stage;

activating first and second pre-output drive signals in accordance with said pre-output control signal and said output signal by mining one and the other of said pull-up and pull-down circuits on and off, respectively, when said output signal is at one of said logic 0 and logic 1 signal levels and mining off said pull-up and pull-down circuits after said output signal has reached said pre-output signal level intermediate to said logic 0 and logic 1 signal levels, wherein said activated first and second pre-output drive signals cause said output buffer circuit to turn off after said output signal has reached said pre-output signal level intermediate to said logic 0 and logic 1 signal levels.

19. A low power method of driving an output buffer circuit and selectively causing said output buffer circuit to provide an output signal having a pre-output signal level intermediate to logic 0 and logic 1 signal levels, wherein said output buffer circuit includes an input stage for receiving and buffering complementary data signals and an output stage with an output node and pull-up and pull-down circuits coupled thereto for providing said output signal with said logic 0 and logic 1 signal levels in accordance with said buffered complementary data signals, said method comprising the steps of:

receiving a pre-output control signal;

isolating said pull-up and pull-down circuits from said buffered complementary data signals in accordance with said pre-output control signal;

receiving said output signal from said output stage;

activating first and second pre-output drive signals in accordance with said pre-output control signal and said output signal by generating said pre-output drive signal in accordance with hysteresis, said output signal and said pre-output control signal, wherein said activated first and second pre-output drive signals cause said output buffer circuit to turn off after said output signal has reached said pre-output signal level intermediate to said logic 0 and logic 1 signal levels.

20. An apparatus including an output buffer circuit with low power pre-output driving capability, said output buffer circuit comprising:

an output circuit for receiving first and second logic signals and first and second pre-output drive signals and providing an output signal, wherein a portion of said output circuit is turned on and said output signal has logic 0 and logic 1 signal levels in accordance with said first and second logic signals, and wherein said output circuit is turned off after said output signal has reached a pre-output signal level intermediate to said logic 0 and logic 1 signal levels in accordance with said first and second pre-output drive signals; and a control circuit, coupled to said output circuit, for receiving first and second input signals, a pre-output control signal and said output signal and in accordance therewith providing said first and second logic signals and said first and second pre-output drive signals, wherein said first and second pre-output drive signals turn portions of said output circuit on and off in accordance with said pre-output signal level of said output signal, and wherein said control circuit comprises a feedback circuit for receiving said pre-output control signal and said output signal and in accordance therewith providing said first and second pre-output drive signals, and further wherein said control circuit further comprises an input circuit for receiving said first and second input signals and said pre-output control signal and in accordance therewith providing said first and second logic signals.

21. The apparatus of claim 20, wherein said first and second logic signals are provided in accordance with a first state of said pre-output control signal, and wherein said first and second logic signals are turned off in accordance with a second state of said pre-output control signal.

22. An apparatus including an output buffer circuit with low power pre-output driving capability, said output buffer circuit comprising:

an output circuit for receiving first and second logic signals and first and second pre-output drive signals and providing an output signal, wherein a portion of said output circuit is turned on and said output signal has logic 0 and logic 1 signal levels in accordance with said first and second logic signals, and wherein said output circuit is turned off after said output signal has reached a pre-output signal level intermediate to said logic 0 and logic 1 signal levels in accordance with said first and second pre-output drive signals; and a control circuit, coupled to said output circuit, for receiving first and second input signals, a pre-output control signal and said output signal and in accordance therewith providing said first and second logic signals and said first and second pre-output drive signals, wherein said first and second pre-output drive signals turn portions of said output circuit on and off in accordance with said pre-output signal level of said output signal, and wherein said control circuit comprises a plurality of inverters with three-state outputs.

23. A method of driving an output buffer circuit for providing a low power pre-output signal, said method comprising the steps of:

receiving first and second input signals;

receiving a pre-output control signal;

providing first and second logic signals in accordance with said first and second input signals and said pre-output control signal by providing said first and second logic signals in accordance with a first state of said pre-output control signal and turning off said first and second logic signals in accordance with a second state of said pre-output control signal;

receiving first and second pre-output drive signals;

driving an output buffer circuit for providing an output signal, wherein a portion of said output buffer circuit is turned on and said output signal has logic 0 and logic 1 signal levels in accordance with said first and second logic signals, and wherein said output buffer circuit is turned off after said output signal has reached a pre-output signal level intermediate to said logic 0 and logic 1 signal levels in accordance with said first and second pre-output drive signals;

receiving said output signal; and providing said first and second pre-output drive signals in accordance with said output signal and said pre-output control signal, wherein said first and second pre-output drive signals turn portions of said output buffer circuit on and off in accordance with said pre-output signal level of said output signal.

\* \* \* \* \*

UNITED STATES PATENT AND TRADEMARK OFFICE
CERTIFICATE OF CORRECTION

PATENT NO. : 5,654,648
DATED : August 5, 1997
INVENTOR(S) : AJIT K. MEDHEKAR ET AL.

It is certified that error appears in the above-indentified patent and that said Letters Patent is hereby corrected as shown below:

In Col. 8, line 33, delete "pre--output" and replace with --pre-output--.

In Col. 10, line 37, delete "mining" and replace with --turning--.

In Col. 10, line 40, delete "mining" and replace with --turning--.

Signed and Sealed this

Thirtieth Day of September, 1997

Attest:

BRUCE LEHMAN

Attesting Officer

Commissioner of Patents and Trademarks